United States Patent [19]

Kurihara

[11] Patent Number: 5,767,002
[45] Date of Patent: Jun. 16, 1998

[54] METHOD OF MANUFACTURING A MULTI-LAYER FILM EACH LAYER HAVING SINGLE-LAYER AREA

[75] Inventor: Shunsuke Kurihara, Hamamatsu, Japan

[73] Assignee: Yamaha Corporation, Shizuoka, Japan

[21] Appl. No.: 614,371

[22] Filed: Mar. 12, 1996

[30] Foreign Application Priority Data

Mar. 15, 1995 [JP] Japan .................. 7-083120

[51] Int. Cl.$^6$ .................. C23C 16/00; H01L 21/20; H01L 21/36
[52] U.S. Cl. .................. 438/481; 118/728
[58] Field of Search .................. 118/728; 438/481

[56] References Cited

U.S. PATENT DOCUMENTS 5,421,401  6/1995  Sherstinsky et al. .................. 118/728

*Primary Examiner*—Brian Dutton

[57] ABSTRACT

A multi-layer film is formed on a semiconductor wafer using chambers of a multi-chamber sputtering system by using wafer clampers of different shape. Wafer clampers each have a shield area near at the orientation flat of the wafer and a recess in the shielding area at a different position. At each process of sequential film forming processes, a single layer area of the multi-layer film is formed on the semiconductor wafer at the area corresponding to the recess. The film quality of each layer can be measured at the single layer area. A semiconductor device manufacturing method is provided which can easily and precisely measure the quality of each layer of a multi-layer film.

10 Claims, 5 Drawing Sheets

5,767,002

1

METHOD OF MANUFACTURING A MULTI-LAYER FILM EACH LAYER HAVING SINGLE-LAYER AREA

BACKGROUND OF THE INVENTION a) Field of the Invention

The present invention relates to a method of manufacturing a semiconductor device, and more particularly a method of manufacturing a semiconductor device having processes of forming a multi-layer film with a semiconductor manufacturing system having a plurality of process chambers.

b) Description of the Related Art

Many semiconductor manufacturing methods include a process of forming a multi-layer film by sequentially depositing one layer after another. For such sequential film forming, a so-called multi-chamber processing system having a plurality of process chambers is generally used. In forming a multi-layer film or etching it with such a multi-chamber processing system, a semiconductor wafer is transported from one chamber to another without exposing it to the external atmosphere (air).

Measurement of a sheet resistance, film thickness, film step, and so on for each layer is not possible or difficult, after a multi-layer film is once formed by sequentially depositing each layer on a semiconductor wafer by using a multi-chamber processing system. In order to control the film quality of each layer formed at each chamber, it is necessary to measure the characteristics of each layer by taking the semiconductor wafer out of the chamber. Even if such measurement is performed after each process of forming a film layer, only a total sheet resistance of, for example, a two-layer metal film can be measured, but the single sheet resistance of the second layer alone cannot be measured or is difficult to measure.

SUMMARY OF THE INVENTION

It is an object of the present invention to provide a method of manufacturing a semiconductor device capable of easily and reliably measuring the characteristics of each layer of a multi-layer film formed by sequentially depositing one layer after another.

According to one aspect of the present invention, there is provided a method of manufacturing a semiconductor device comprising the step of: forming a multi-layer film by using a different wafer clamper at each process of forming each layer of the multi-layer film, each wafer clamper having a common shielding area to that of other wafer clamper or clampers, covering part of the surface of a semiconductor wafer and a recess in the shielding area at a different position from that of other wafer clamper or clampers.

According to another aspect of the present invention, there is provided a method of manufacturing a semiconductor device comprising the steps of: forming a first film by using a first wafer clamper having a shielding area covering a first area of the surface of a semiconductor wafer; forming a second film on the first film by using a second wafer clamper having a shielding area covering a second area of the surface of the semiconductor wafer; and forming a third film on the second film by using a third wafer clamper having a shielding area covering a third area of the surface of the semiconductor wafer, wherein the shielding areas are formed so that each layer of a multi-layer film has an area where only the layer is formed and other layers are not formed.

For example, in forming a three-layer film, the clamp at each process has a shielding area not covering one area and

2 the other clamps at the two processes have the shielding areas covering the one area. These clampers may be a set of clampers each having a recess formed at a different position in a same shielding area.

A wafer clamper having a recess at a different position is used for each process of forming a multi-layer film so that a single-layer film is formed at each process at the position corresponding to the recess. Therefore, even after sequential multi-layer film formation, the characteristics of each layer of the multi-layer film formed at each process can be precisely measured. For example, the characteristics of each layer of a multi-layer film formed sequentially can be measured by using a single monitor wafer. Instead of a monitor wafer, a product wafer may be used for checking the quality of each layer of a multi-layer film.

As above, even after sequential multi-layer film formation, the quality of each layer of the multi-layer film of a semiconductor device can be measured precisely so that quality management of each layer becomes easy and reliable.

DETAILED DESCRIPTION OF THE PREFERRED EMBODIMENTS

Embodiments of the invention will be described with reference to the accompanying drawings.

Figure 1:
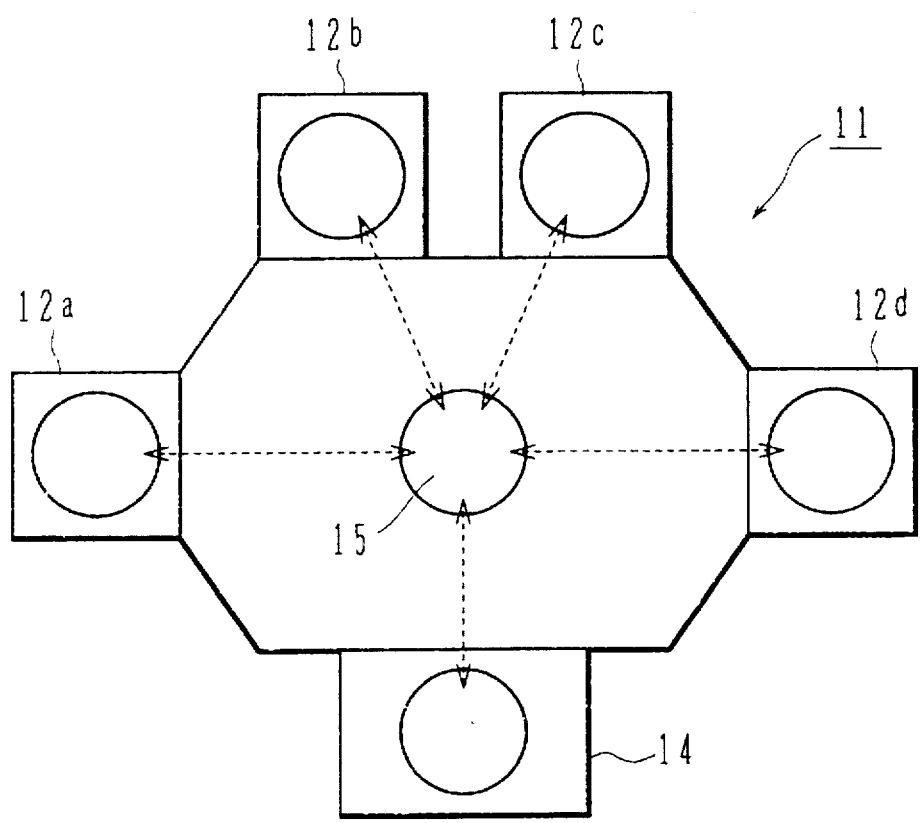
FIG. 1 is a schematic cross sectional view of a multi-chamber sputtering system used for forming a multi-layer film according to an embodiment of the invention.
Figure 2A:
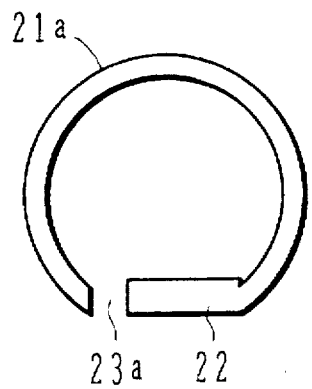
FIGS. 2A to 2D are plan views showing wafer clampers used at chambers of the sputtering system shown in FIG. 1.
Figure 2B:
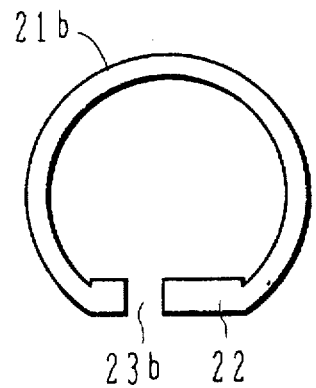
Figure 2C:
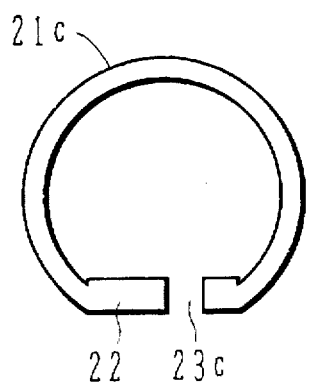
Figure 2D:
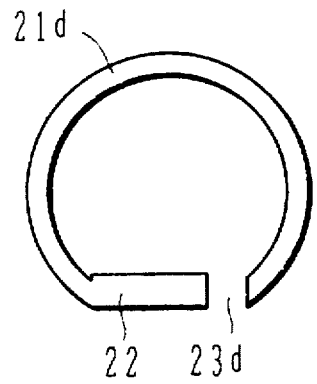

FIG. 1 is a schematic diagram showing the structure of a multi-chamber sputtering system 11 used for forming a multi-layer film according to an embodiment of the invention. In this system, a wafer clamper having a different recess is used for each process at each of the plurality of chambers to form a multi-layer film each layer having a single-layer area. The characteristics of each layer of a multi-layer film can be measured without etching the wafer. The sputtering system 11 has first to fourth chambers 12a to 12d. A semiconductor wafer loaded from a load/unload chamber 14 is sequentially transported from the first chamber 12a, to the second, third, and fourth chambers 12b, 12c, and 12d to form each layer of a four-layer film under different film forming conditions. It will be apparent that a two- or three-layer film can also be formed using any two or three chambers of the four.

At the first to fourth chambers 12a to 12d of the sputtering system shown in FIG. 1, wafer clampers of different shapes are used. FIGS. 2A to 2D show the shapes of wafer clampers 21a to 21d used at the first to fourth chambers 12a to 12d. These wafer clampers 21a to 21d have a common relatively wide shielding area 22 covering a semiconductor wafer near at the orientation flat and recesses 23a to 23d in the shielding area 22 at different positions.

Figure 3:
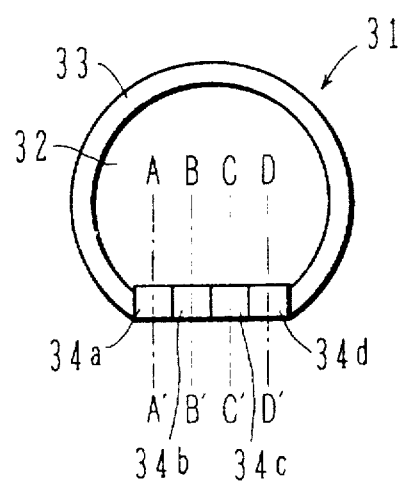
FIG. 3 is a plan view of a semiconductor wafer with a multi-layer film formed by the sputtering system shown in FIG. 1.

Layers of a multi-layer film are sequentially sputtered on a semiconductor wafer at the first to fourth chambers 12a to 12d by using the wafer clampers 21a to 21d having the recesses 23a to 23d at different positions. FIG. 3 is a plan view of a semiconductor wafer formed with a multi-layer film, and FIGS. 4A to 4D are cross sectional views taken along lines 4A—4A, 4B—4B, 4C—4C and 4D—4D of FIG. 3.

As shown in FIG. 3, an area 33 without a film is formed at the peripheral area of a multi-layer film area 32 on the semiconductor wafer 31, at this peripheral area the semiconductor wafer 31 being held by the wafer clampers 21a to 21d. Areas 34a to 34d with only a single layer film are formed at the areas corresponding to the recesses 23a to 23d in the shielding areas of the wafer clampers 21a to 21d.

Figure 4A:
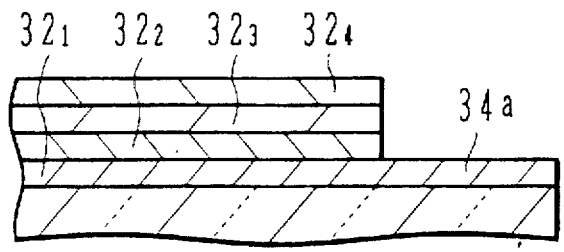
FIGS. 4A to 4D are cross sectional views of the semiconductor wafer taken along lines 4A—4A, 4B—4B, 4C—4C, and 4D—4D of FIG. 3.

FIGS. 4A to 4D are cross sectional views showing the areas where single layer films of the semiconductor wafer 31 are formed. As shown in FIG. 4A along line 4A—4A, of the first to fourth layers $32_1$, to $32_4$, only the first layer $32_1$ is formed and exposed at a single layer area 34a corresponding to the recess 23a of the wafer clamper 21a.

Figure 4B:
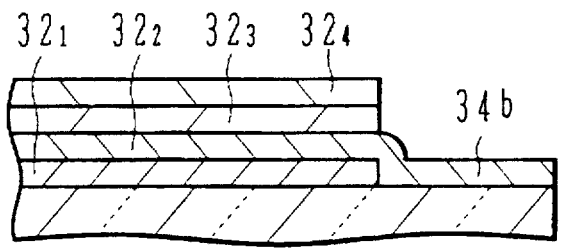
Figure 4C:
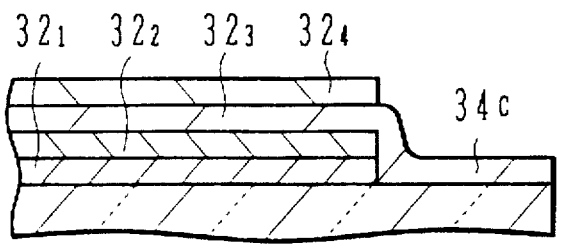
Figure 4D:
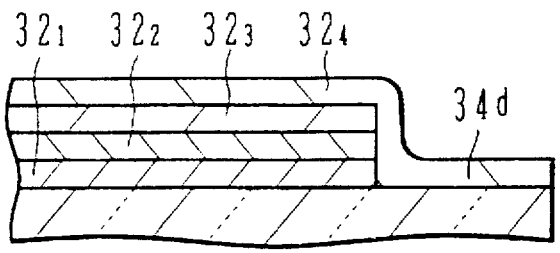
Figure 5A:
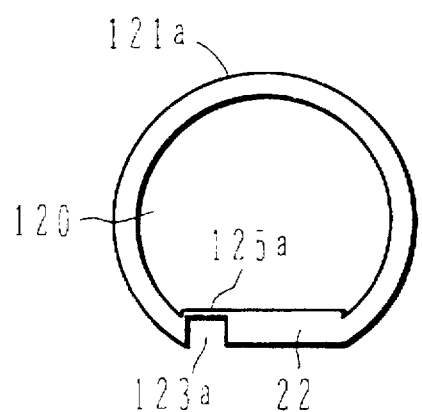
FIGS. 5A to 5D are plan views showing wafer clampers used at chambers of the sputtering system shown in FIG. 1.
Figure 5B:
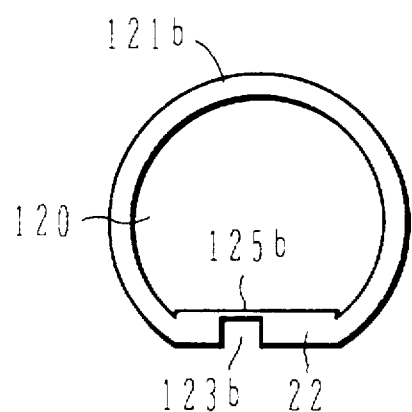
Figure 5C:
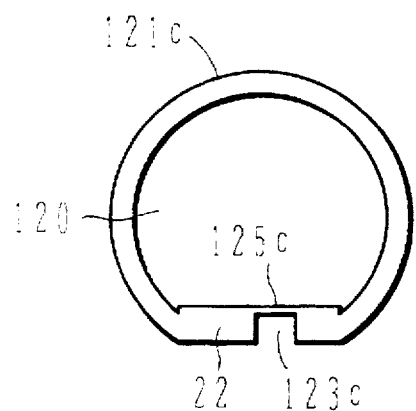
Figure 5D:
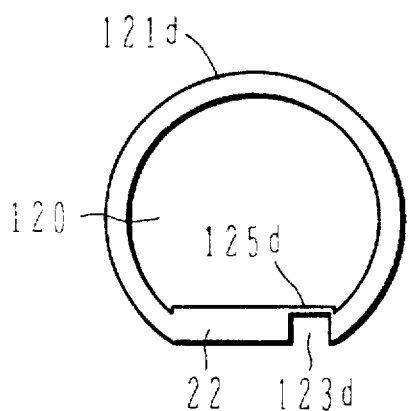
Figure 6A:
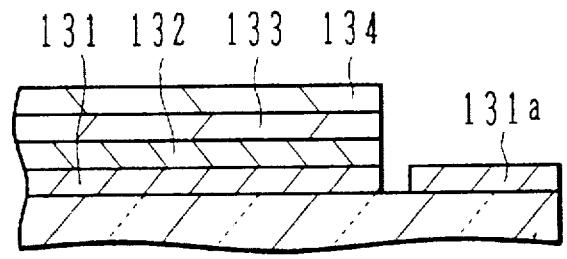
FIGS. 6A to 6D are cross sectional views of the semiconductor wafer with a four-layer film formed by using the wafer clampers shown in FIGS. 5A to 5D.
Figure 6B:
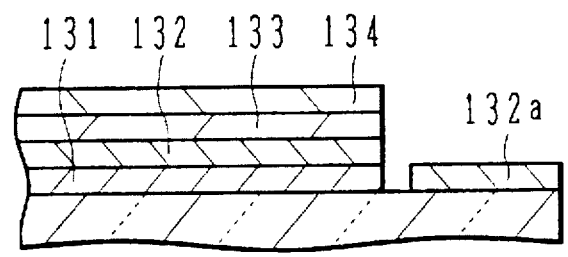
Figure 6C:
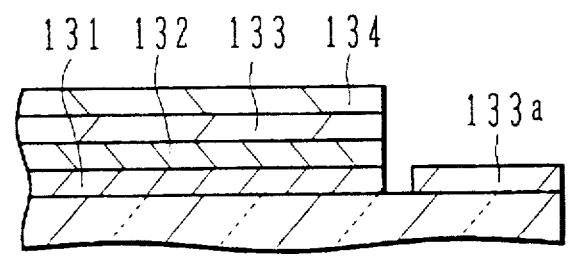
Figure 6D:
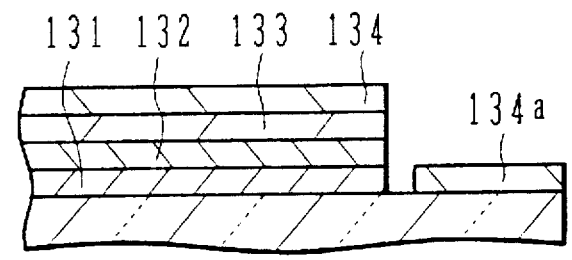

As shown in FIG. 4B along line 4B—4B, only the second layer $32_2$ is formed and exposed at a single layer area 34b corresponding to the recess 23b. As shown in FIGS. 4C and 4D along lines 4D—4D and D—D', only the third and fourth layers $32_3$ and $32_4$ are formed and exposed at single layer areas 34c and 34d corresponding to the recesses 23c and 23d.

A sheet resistance, film thickness, film step, and the like of each layer formed at each process can be measured at the single layer area 34a to 34d, after the sequential film forming processes. It is therefore possible to control the film quality at each chamber by using only one wafer after a series of sputtering processes. Instead of a monitor wafer, a product wafer may be used for controlling the film forming processes for both products and chambers.

The recesses 23a to 23d of the clampers shown in FIGS. 2A to 2D are joined to the inner area of the semiconductor wafer. Therefore, as shown in FIGS. 4A to 4C, the single layer areas 34a to 34c are also joined to the multi-layer film area 32.

FIGS. 5A to 5D show clampers 121a to 121d according to another embodiment. These clampers have bars 125a to 125d between a central window area 120 of the semiconductor wafer and recesses 123a to 123d, the bars separating the window area 120 from the recesses 123a to 123d.

FIGS. 6A to 6D are cross sectional views of a multi-layer film and its single layer areas formed by using the clampers shown in FIGS. 5A to 5D. A multi-layer film having layers 131, 132, 133, and 134 is formed at the central window area 120, and near at the orientation flat, single layer films 131a, 132a, 133a, and 134a are formed corresponding to the recesses 123a to 123d. Each single layer film area is separated from the multi-layer film area, so that a sheet resistance or other electric or electronic parameters can be measured more easily and precisely.

This invention is not limited only to the above embodiments. For example, instead of a sputtering system, other physical deposition or chemical vapor deposition systems may also be used for forming a multi-layer film. Instead of a multi-chamber sputtering system, each layer of a multi-layer film may be formed by independent and separate film forming systems. The shielding area of a wafer clamper may be formed at a desired wafer peripheral area other than near at the orientation flat.

It is apparent to those skilled in the art that various modifications, improvements, combinations and the like can be made without departing from the scope of the appended claims.

I claim:

1. A method of manufacturing a semiconductor device comprising the step of:

forming a multi-layer film by using a different wafer clamper at each process of forming each layer of the multi-layer film, each different wafer clamper having a common shielding area to that of other of said different wafer clamper or clampers, covering part of the surface of a semiconductor wafer and a recess in the shielding area at a different position from that of other of said different wafer clamper or clampers.

2. A method according to claim 1, wherein said shielding area covers a peripheral area of said semiconductor wafer.

3. A method according to claim 2, wherein said peripheral area includes an area near an orientation flat.

4. A method according to claim 1, wherein said multi-layer film has three or more layers, and said different wafer clampers have recesses at adjacent three areas in the shielding area.

5. A method according to claim 1, wherein said shielding area of one of said different wafer clampers has an area separating the central area of a semiconductor wafer and the recess.

6. A method of manufacturing a semiconductor device comprising the steps of:

forming a first layer by using a first wafer clamper having a shielding area covering a first area of the surface of a semiconductor wafer;

forming a second layer on said first layer by using a second wafer clamper having a shielding area covering a second area of the surface of the semiconductor wafer; and forming a third layer on said second layer by using a third wafer clamper having a shielding area covering a third area of the surface of the semiconductor wafer, wherein said shielding areas are so formed that said semiconductor wafer has a plurality of single layer areas in which only one of said first, second and third layers is formed and others of said first, second and third layers are not formed.

7. A method according to claim 6, wherein each of said shielding areas of said first, second and third wafer clampers covers a peripheral area of said semiconductor wafer.

8. A method according to claim 7, wherein said peripheral area includes an area near an orientation flat.

9. A method according to claim 6, wherein said areas of said first, second and third layer where a single layer of said multi-layer film is formed, are disposed adjacently.

10. A method according to claim 6, wherein said multi-layer film and the area where a single layer is formed are separated.

* * * * *